US008064255B2

(12) United States Patent
Scade et al.

(10) Patent No.: US 8,064,255 B2
(45) Date of Patent: Nov. 22, 2011

(54) ARCHITECTURE OF A NVDRAM ARRAY AND ITS SENSE REGIME

(75) Inventors: Andreas Scade, Dresden (DE); Stefan Guenther, Dresden (DE)

(73) Assignee: Cypress Semiconductor Corporation, San Jose, CA (US)

( * ) Notice: Subject to any disclaimer, the term of this patent is extended or adjusted under 35 U.S.C. 154(b) by 65 days.

(21) Appl. No.: 12/006,226

(22) Filed: Dec. 31, 2007

(65) Prior Publication Data

US 2009/0168519 A1 Jul. 2, 2009

(51) Int. Cl.
*G11C 14/00* (2006.01)
*G11C 11/24* (2006.01)
*G11C 16/06* (2006.01)

(52) U.S. Cl. .................... 365/185.08; 365/149
(58) Field of Classification Search .............. 365/185.08
See application file for complete search history.

(56) References Cited

U.S. PATENT DOCUMENTS

| | | | |
|---|---|---|---|
| 2,791,760 A | 5/1957 | Ross | |
| 3,636,530 A | 1/1972 | Mark et al. | |
| 3,676,717 A | 7/1972 | Lockwood | |
| 3,950,737 A | 4/1974 | Uchida et al. | |
| 3,811,076 A | 5/1974 | Smith | |
| 3,836,894 A | 9/1974 | Cricchi | |
| 3,846,768 A | 11/1974 | Krick | |
| 4,044,343 A | 8/1977 | Uchida | |
| 4,090,259 A | 5/1978 | Wilcock et al. | |
| 4,103,344 A | 7/1978 | Fagan et al. | |
| 4,103,348 A | 7/1978 | Fagan | |
| 4,112,507 A | 9/1978 | White et al. | |
| 4,128,773 A | 12/1978 | Troutman et al. | |
| 4,132,904 A | 1/1979 | Harari | |
| 4,138,737 A | 2/1979 | McCann | |
| 4,143,286 A | 3/1979 | Koike et al. | |
| 4,158,241 A | 6/1979 | Takemae et al. | |
| 4,175,291 A | 11/1979 | Spence | |
| 4,264,376 A | 4/1981 | Yatsuda et al. | |
| 4,270,188 A | 5/1981 | Saito | |
| 4,271,487 A | 6/1981 | Craycraft et al. | |
| 4,306,353 A | 12/1981 | Jacobs et al. | |
| 4,342,101 A | 7/1982 | Edwards et al. | |
| 4,354,255 A | 10/1982 | Stewart | |
| 4,363,110 A * | 12/1982 | Kalter et al. | 365/185.08 |
| 4,370,798 A | 2/1983 | Lien et al. | |
| 4,375,086 A | 2/1983 | van Velthoven | |
| 4,403,306 A | 9/1983 | Tokushige et al. | |
| 4,432,072 A * | 2/1984 | Chao et al. | 365/185.08 |
| 4,446,535 A * | 5/1984 | Gaffney et al. | 365/185.2 |
| 4,449,205 A | 5/1984 | Hoffman | |

(Continued)

FOREIGN PATENT DOCUMENTS

JP  0136994 A  7/1985

(Continued)

OTHER PUBLICATIONS

U.S. Appl. No. 12/006,227 "3T High Density NVDRAM Cell," Scade et al.; 26 pages.

(Continued)

*Primary Examiner* — Son L Mai

(57) ABSTRACT

A process of operating a memory array includes performing all volatile and nonvolatile operations on an nvDRAM cell array via a single data interface and using only DRAM-level signals on the data interface.

14 Claims, 4 Drawing Sheets

U.S. PATENT DOCUMENTS

| | | | |
|---|---|---|---|
| 4,527,255 A | 7/1985 | Keshtbod | |
| 4,541,006 A | 9/1985 | Ariizumi et al. | |
| 4,541,073 A | 9/1985 | Brice et al. | |
| 4,560,419 A | 12/1985 | Bourassa et al. | |
| 4,597,062 A | 6/1986 | Asano et al. | |
| 4,609,999 A | 9/1986 | Rosini | |
| 4,611,309 A * | 9/1986 | Chuang et al. | 365/185.08 |
| 4,617,652 A | 10/1986 | Simko | |
| 4,651,303 A | 3/1987 | Dias et al. | |
| 4,675,715 A | 6/1987 | Lepselter et al. | |
| 4,679,170 A | 7/1987 | Bourassa et al. | |
| 4,694,428 A | 9/1987 | Matsumura et al. | |
| 4,698,787 A | 10/1987 | Mukherjee et al. | |
| 4,701,858 A | 10/1987 | Stokes et al. | |
| 4,703,456 A | 10/1987 | Arakawa | |
| 4,725,983 A | 2/1988 | Terada | |
| 4,747,083 A | 5/1988 | Nakajima et al. | |
| 4,758,993 A | 7/1988 | Takemae | |
| 4,769,787 A | 9/1988 | Furusawa et al. | |
| 4,774,203 A | 9/1988 | Ikeda et al. | |
| 4,790,194 A | 1/1989 | Arakawa | |
| 4,799,194 A | 1/1989 | Arakawa | |
| 4,800,533 A | 1/1989 | Arakawa | |
| 4,805,150 A | 2/1989 | Asano et al. | |
| 4,819,207 A | 4/1989 | Sakui et al. | |
| 4,823,318 A | 4/1989 | D'Arrigo et al. | |
| 4,858,185 A | 8/1989 | Kowshik et al. | |
| 4,858,194 A | 8/1989 | Terada et al. | |
| 4,870,615 A | 9/1989 | Maruyama et al. | |
| 4,924,438 A | 5/1990 | Kobatake | |
| 4,931,997 A | 6/1990 | Mitsuishi et al. | |
| 4,952,825 A | 8/1990 | Yoshida | |
| 4,962,481 A | 10/1990 | Choi et al. | |
| 4,962,484 A | 10/1990 | Takeshima et al. | |
| 5,018,108 A | 5/1991 | Maruyama | |
| 5,021,998 A | 6/1991 | Suzuki et al. | |
| 5,031,149 A | 7/1991 | Matsumoto et al. | |
| 5,043,946 A | 8/1991 | Yamauchi et al. | |
| 5,051,958 A | 9/1991 | Arakawa | |
| 5,060,195 A | 10/1991 | Gill et al. | |
| 5,065,362 A | 11/1991 | Herdt et al. | |
| 5,097,449 A | 3/1992 | Cuevas | |
| 5,109,187 A | 4/1992 | Guliani | |
| 5,111,257 A | 5/1992 | Andoh et al. | |
| 5,140,551 A | 8/1992 | Chiu | |
| 5,140,552 A | 8/1992 | Yamauchi et al. | |
| 5,168,334 A | 12/1992 | Mitchell et al. | |
| 5,189,641 A | 2/1993 | Arakawa | |
| 5,214,606 A | 5/1993 | Hashimoto | |
| 5,241,507 A | 8/1993 | Fong | |
| 5,245,570 A | 9/1993 | Fazio et al. | |
| 5,247,480 A | 9/1993 | Itoh et al. | |
| 5,251,171 A | 10/1993 | Yamauchi | |
| 5,253,206 A | 10/1993 | Tanaka et al. | |
| 5,262,986 A | 11/1993 | Yamauchi | |
| 5,282,175 A | 1/1994 | Fujita et al. | |
| 5,283,764 A | 2/1994 | Kim et al. | |
| 5,287,319 A | 2/1994 | Fukumoto | |
| 5,353,248 A | 10/1994 | Gupta | |
| 5,357,465 A | 10/1994 | Challa | |
| 5,387,534 A | 2/1995 | Prall | |
| 5,424,569 A | 6/1995 | Prall | |
| 5,426,605 A | 6/1995 | Van Berkel et al. | |
| 5,436,480 A | 7/1995 | Yu | |
| 5,440,508 A | 8/1995 | Pathak et al. | |
| 5,467,300 A | 11/1995 | Komarek et al. | |
| 5,485,429 A | 1/1996 | Ono | |
| 5,488,579 A | 1/1996 | Sharma et al. | |
| 5,495,756 A | 3/1996 | Sharma et al. | |
| 5,506,816 A | 4/1996 | Hirose et al. | |
| 5,510,638 A | 4/1996 | Lancaster et al. | |
| 5,511,020 A | 4/1996 | Hu et al. | |
| 5,602,776 A | 2/1997 | Herdt et al. | |
| 5,617,357 A | 4/1997 | Haddad et al. | |
| 5,619,470 A * | 4/1997 | Fukumoto | 365/228 |
| 5,638,323 A | 6/1997 | Itano | |
| 5,644,533 A | 7/1997 | Lancaster et al. | |
| 5,656,837 A | 8/1997 | Lancaster et al. | |
| 5,760,644 A | 6/1998 | Lancaster et al. | |
| 5,768,208 A | 6/1998 | Bruwer et al. | |
| 5,774,400 A | 6/1998 | Lancaster et al. | |
| 5,789,776 A | 8/1998 | Lancaster et al. | |
| 5,864,499 A | 1/1999 | Roohparvar et al. | |
| 5,892,712 A | 4/1999 | Hirose et al. | |
| 5,914,895 A | 6/1999 | Jenne | |
| 6,026,018 A | 2/2000 | Herdt | |
| 6,122,191 A | 9/2000 | Hirose et al. | |
| 6,141,248 A | 10/2000 | Forbes et al. | |
| 6,172,907 B1 | 1/2001 | Jenne | |
| 6,222,765 B1 | 4/2001 | Nojima | |
| 6,285,586 B1 | 9/2001 | Lung et al. | |
| 6,363,011 B1 | 3/2002 | Hirose et al. | |
| 6,414,873 B1 | 7/2002 | Herdt | |
| 6,532,169 B1 | 3/2003 | Mann et al. | |
| 6,556,487 B1 | 4/2003 | Ratnakumar et al. | |
| 6,674,665 B1 | 1/2004 | Mann et al. | |
| 6,954,377 B2 * | 10/2005 | Choi et al. | 365/185.08 |
| 6,965,145 B2 | 11/2005 | Choi | |
| 7,110,293 B2 | 9/2006 | Jung | |
| 7,164,608 B2 | 1/2007 | Lee | |
| 7,186,612 B2 * | 3/2007 | Choi | 438/238 |
| 7,224,609 B2 * | 5/2007 | Ahn et al. | 365/185.18 |
| 7,233,522 B2 | 6/2007 | Chen et al. | |
| 7,280,397 B2 | 10/2007 | Scheuerlein | |
| 7,295,475 B2 | 11/2007 | Akaogi et al. | |
| 7,333,363 B2 | 2/2008 | Nakai et al. | |
| 7,423,912 B2 | 9/2008 | Perlegos et al. | |
| 7,429,767 B2 | 9/2008 | Bhattacharyya | |
| 7,499,322 B2 | 3/2009 | Lee et al. | |
| 7,518,910 B2 | 4/2009 | Ashokkumar et al. | |
| 7,512,403 B2 | 11/2009 | Bhattacharyya | |
| 7,612,403 B2 | 11/2009 | Bhattacharyya | |
| 2007/0045711 A1 | 3/2007 | Bhattacharyya | |
| 2009/0147578 A1 | 6/2009 | Scade et al. | |

FOREIGN PATENT DOCUMENTS

| | | |
|---|---|---|
| JP | 61077197 A | 4/1986 |
| JP | 60136994 | 7/1998 |
| WO | WO 9530244 A1 | 9/1995 |
| WO | WO 9715929 91 A1 | 1/1997 |

OTHER PUBLICATIONS

U.S. Appl. No. 12/006,270 "5T High Density NVDRAM Cell," Scade et al.; 30 pages.

International Search Report of the International Searching Authority for International Application No. PCT/US08/87795 dated Feb. 18, 2009; 2 pages.

International Written Opinion of the International Searching Authority for International Application No. PCT/US08/87795 dated Feb. 18, 2009; 5 pages.

U.S. Appl. No. 09/871,172: "Non-Volatile Static Memory Cell," Ratnakumar et al.; 56 pages.

USPTO Non-Final Rejection for U.S. Appl. No. 12/006,227 dated Jan. 20, 2010; 6 pages.

USPTO Notice of Allowance for U.S. Appl. No. 12/806,270 dated Dec. 18, 2009; 6 pages.

USPTO Non-Final Rejection for U.S. Appl. No. 12/006,270 dated Aug. 24, 2009; 13 pages.

USPTO Notice of Allowance for U.S. Appl. No. 09/681,317 dated Mar. 13, 2002; 4 pages.

USPTO Non-Final Rejection U.S. Appl. No. 09/681,317 dated Jul. 24, 2001: 9 pages.

Herdt et al., "Analysis, Measurement, and Simulation of Dynamic Write Inhibit in a nvSRAM Cell," 1992, IEEE; 6 pages.

USPTO Notice of Allowance for U.S. Appl. No. 09/871,172 dated Dec. 13, 2002; 4 pages.

USPTO Non-Final Rejection for U.S. Appl. No. 09/871,172 dated Jul. 22, 2002; 6 pages.

USPTO Notice of Allowance for U.S. Appl. No. 08/549,483 dated Aug. 8, 1996; 3 pages.

USPTO Non-Final Rejection for U.S. Appl. No. 08/549,483 dated May 29, 1996; 5 pages.

USPTO Notice of Allowance for U.S. Appl. No. 08/846,558 dated Jul. 20, 1998; 3 pages.
USPTO Requirement Restriction for U.S. Appl. No. 09/136,694 dated Aug. 17, 1999; 4 pages.
Frohman-Bentchkowsky, "The Methal-Nitrice-Oxide-Silicon (MNOS) Transistor -Characteristics and Applications," Proceedings of the IEEE, vol. 58, No. 8, Aug. 1970, pp. 1207-1219; 13 pages.
Donaldson et al., "SNOS 1K X 8 Static Nonvolatile RAM," IEEE Journal of Solid-State Circuits, vol. SC-17 No. 5, Oct. 1982, pp. 847-851: 5 pages.
Hirose et al.. "Non-Volatile Latch for FPGA Device," NVX Corporation, Jan. 10, 1995; 6 pages.
Hirose et al., "Non-Volatile Latch Description," NVX Corporation, Nov. 1, 1995; 23 pages.
Hirose et al., "Non-Volatile Latch for Semiconductor Devices," NVX Corporation, Sep. 8, 1994; 13 pages.
USPTO Notice of Allowance for U.S. Appl. No. 07/361,033 dated Apr. 30, 1991; 4 pages.
USPTO Final Rejection for U.S. Appl. No. 07/361,033 dated Jan. 18, 1991; 5 pages.
USPTO Non -Final Rejection for U.S. Appl. No. 07/361,033 dated Jun. 12, 1990; 11 pages.
USPTO Notice of Allowance for U.S. Appl. No. 11/644,819 dated Dec. 4, 2008; 7 pages.
"nvSRAM Basics," Simtek 1999 Data Book, 1999, Chapter 8-1 through 8-5; 5 pages.
USPTO Notice of Allowance for U.S. Appl. No. 08/926,611 dated Dec. 14, 1998 3 pages.
USPTO Non-Final Rejection for U.S. Appl. No. 08/926,611 dated Jul 7, 1998, 5 pages.
Betty Price, "Semiconductor Memories: A Handbook of Design, Manufacture and Application," Second Edition, Texas Instruments, John Wiley & Sons, 1983. pp. 611-620: 11 pages.
Herdt et al., "A 256K Nonvolatile Static RAM," Simtek Corporation, No. 3. 1995. pp. 1-4; 4 pages.
Ohnakado et al. "Novel Electron Injection Method Using Band-to-Band Tunneling Induced Hot Electron (BBHE) for Flash Memory with a P-Channel Cell," IEDM 95-279, 1995, pp. 11.5.1-11.5.4; 4 pages.
USPTO Notice of Allowance for U.S. Appl. No. 11/999,684 dated Oct. 16, 2009; 4 pages.
USPTO Non-Final Rejection for U.S. Appl. No. 11/999,684 dated Mar. 18, 2009; 9 pages.
International Search Report of the in national Searching Authority for International Application Number PCT/US08/85688 dated Jan. 14, 2009; 1 page.
Benini et al.. "Energy-Adware Design of Embedded Memories: A Survey of Technologies, Architectures, and Optimization Techniques," ACM Transactions on Embedded Computing Systems (TECS) [online], vol. 2, No. 1 Feb. 2003, pp. 5-32 [retrieved on Jan. 9, 2009], <http://www.dii.unis/it/~giorgi/didattica/lp_ca/references/Benini03-ACMTECS-Entergy_Aware%20Design%20of20Embedded%20memories%20a%20survery%20of%20technologies.pdf>; 28 pages.
USPTO Notice of Allowance for U.S. Appl. No. 09/136,694 dated Apr. 24, 2000; 4 pages.
USPTO Non-Final Rejection for U.S. Appl. No. 09/136,694 dated Nov. 12, 1999; 8 pages.
USPTO Non-Final Rejection for U.S. Appl. No. 12/006,270 dated Apr. 13, 2010; 5 pages.
USPTO Notice of Allowance for U.S. Appl. No. 09/892,164 dated Oct. 17, 2002; 4 pages.
USPTO Non-Final Rejection for U.S. Appl. No. 09/892,164 dated Jun. 27, 2002; 6 pages.
USPTO Notice of Allowance for U.S. Appl. No. 12/006,270 dated Aug. 6, 2010; 6 pages.
USPTO Notice of Allowance for U.S. Appl. No. 12/006,227 dated Aug. 13, 2010; 9 pages.
USPTO Non-Final Rejection for U.S. Appl. No. 12/006,270 dated Feb. 3, 2011; 5 pages.
USPTO Notice of Allowance for U.S. Appl. No. 10/368,528 dated Aug. 21, 2003; 4 pages.
USPTO Non-Final Rejection for U.S. Appl. No. 10/368,528 dated May 20, 2003; 8 pages.
USPTO Notice of Allowance for U.S. Appl. No. 08/549,483 dated Aug. 8, 1996; 3 pages.
USPTO Non-Final Rejection for U.S. Appl. No. 08/549,483 dated May 29, 1996; 5 pages.
USPTO Notice of Allowance for U.S. Appl. No. 07/361,033 dated Apr. 30, 1991; 4 pages.
USPTO Non-Final Rejection for U.S. Appl. No. 07/361,033 dated Jun. 12, 1990; 11 pages.
USPTO Final Rejection for U.S. Appl. No. 07/361,033 dated Jan. 18, 1991; 5 pages.
International Search Report of International Searching Authority, dated Jan. 14, 2009 for International Application No. PCT/US08185688; 2 pages.
International Written Opinion of International Searching Authority, dated Jan. 14, 2009 for International Application No. PCT/US/08/85688; 4 pages.
USPTO Notice of Allowance for U.S. Appl. No. 09/426,100 dated Jul. 19, 2000; 4 pages.
USPTO Non-Final Rejection for U.S. Appl. No. 09/426,100 dated Mar. 10, 2000; 7 pages.
USPTO Notice of Allowance for U.S. Appl. No. 09/136,694 dated Apr. 24, 2000; 4 pages.
USPTO Non-Final Rejection for U.S. Appl. No. 09/136,694 dated Nov. 12, 1999; 8 pages.
USPTO Notice of Allowance for U.S. Appl. No. 09/626,267 dated Aug. 7, 2001; 5 pages.
USPTO Non-Final Rejection for U.S. Appl. No. 09/626,267 dated Mar. 28, 2001; 5 pages.
USPTO Requirement for Restriction/Election for U.S. Appl. No. 09/626,267 dated Dec. 1, 2000; 4 pages.
USPTO Notice of Allowance for U.S. Appl. No. 09/137,914 dated Jun. 9, 1999; 4 pages.
"nvSRAM Basics," Simtek 1999 Data Book, Chapter 8; 8-1 through 8-5; 5 pages.
USPTO Non-Final Rejection for U.S. Appl. No. 08/926,611 dated Jul. 7, 1998; 3 pages.
USPTO Notice of Allowance for U.S. Appl. No. 08/926,611 dated Dec. 14, 1998; 3 pages.
USPTO Non-Final Rejection for U.S. Appl. No. 08/772,970 dated Jun. 11, 1997; 4 pages.
USPTO Notice of Allowance for U.S. Appl. No. 08/234,288 dated Oct. 2, 1995; 1 page.
USPTO Final Rejection for U.S. Appl. No. 08/234,288 dated May 31, 1995; 3 pages.
USPTO Non-Final Rejection for U.S. Appl. No. 08/234,288 dated Oct. 6, 1994; 2 pages.
USPTO Notice of Allowance for U.S. Appl. No. 08/715,569 dated Aug. 19, 1997; 1 page.
USPTO Notice of Allowance for U.S. Appl. No. 08/735,973 dated Nov. 21, 1997; 3 pages.
Svensson et al., "Trap-Assisted Charge Injection in MNOS Structures, " Oct. 1973, J. Appl. Phys., vol. 44, No. 10; 7 pages.
Lundstrom et al., "Properties of MNOS Structures," Jun. 1972, IEEE Transactions on Electron Devices, vol. Ed-19, No. 6, 11 pages.
Takahashi et al., "Estimation of insulation layer Conductrance in MNOS Structure, " Nov. 1993, IEEE Transactions on Electron Devices, vol. 40, No. 11; 5 pages.
USPTO Notice of Allowance for U.S. Appl. No. 11/644,819 dated Dec. 4, 2008; 7 pages.
USPTO Notice of Allowance for U.S. Appl. No. 12/006,270 dated Aug. 6, 20100; 6 pages.
USPTO Non-Final Rejection for U.S. Appl. No. 12/006,270 dated Apr. 13, 2010; 5 pages.
USPTO Notice of Allowance for U.S. Appl. No. 12/006,270 dated Dec. 18, 2009; 6 pages.
USPTO Notice of Allowance for U.S. Appl. No. 11/999,684 dated Oct. 16, 2009; 4 pages.
USPTO Non-Final Rejection for U.S. Appl. No. 11/999,684 dated Mar. 18, 2009; 9 pages.
USPTO Notice of Allowance for U.S. Appl. No. 08/772,970 dated Oct. 15,1997; 2 pages.

USPTO Notice of Allowance for U.S. Appl. No. 09/892,164 dated Oct. 17, 2002; 4 pages.
USPTO Non-Final for U.S. Appl. No. 09/892,164 dated Jun. 27, 2002; 6 pages.
USPTO Notice of Allowance for U.S. Appl. No. 08/772,970 dated Oct. 15, 1997; 2 pages.
USPTO Non-Final Rejection for U.S. Appl. No. 09/137,914 date Jun. 9, 1999; 4 pages.
A 5-V-Only 16Mb Flash Memory with Sector Erase Mode by Jinbo et al., IEEE Jour. Solid State Circuits, vol. 27, No. 11, Nov. 1992 pp. 1547-1554; 8 pages.
A 3.3 V Single-Power-Supply 64 Mb Flash with Dynamic Bit-Line Latch (DBL) Programming Scheme, Takeshima et al., IEEE International Solid-State Circuits Conference, Feb. 1994 pp. 148-149; 2 pages.

U.S. Appl. No. 12/006,22 : "3T High Density NVDRAM Cell," Scade et al.; 26 pages dated Dec. 31, 2007.
U.S. Appl. No. 12/006,270 : "5T High Density NVDRAM Cell," Scade et al.; 30 pages , dated Dec. 31, 2007.
International Search Report of the International Searching Authority for International Application No. PCT/US08/87795 dated Feb. 18, 2009; 2 pages.
International Written Opinion of the International Searching Authority for International Application No. PCT/US08/87795 dated Feb. 18, 2009; 5 pages.
U.S. Appl. No. 09/871,172 : "Non-Volatile Static Memory Cell," Ratnakumar et al.; 56 pages, dated May 31, 2001.

* cited by examiner

ARCHITECTURE OF A NVDRAM ARRAY AND ITS SENSE REGIME

TECHNICAL FIELD

The present disclosure relates to memory circuits.

BACKGROUND

High speed volatile and non-volatile storage of data is an important feature in computer systems. Present solutions use specialized volatile memory technologies, like DRAM and SRAM with non volatile back up memories, such as BBSRAM, EEPROM and FLASH. In case of power loss significant amounts of volatile data may have to be stored in the non-volatile memory. This is typically done via signaling interfaces between volatile and nonvolatile memory regions, the interfaces having limited parallelism, high current requirements, and possibly using multiple processor cycles to manage the data transfer. A faster and less power intensive solution is nvSRAM memories, where each volatile cell is paired with a non-volatile cell and data may pass from one region to another without first being placed on a bus or other signaling interface. One disadvantage of present nvSRAM circuits is their limited density and relatively large memory cell size, typically involving 12 high and low voltage transistor.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Figure 1:
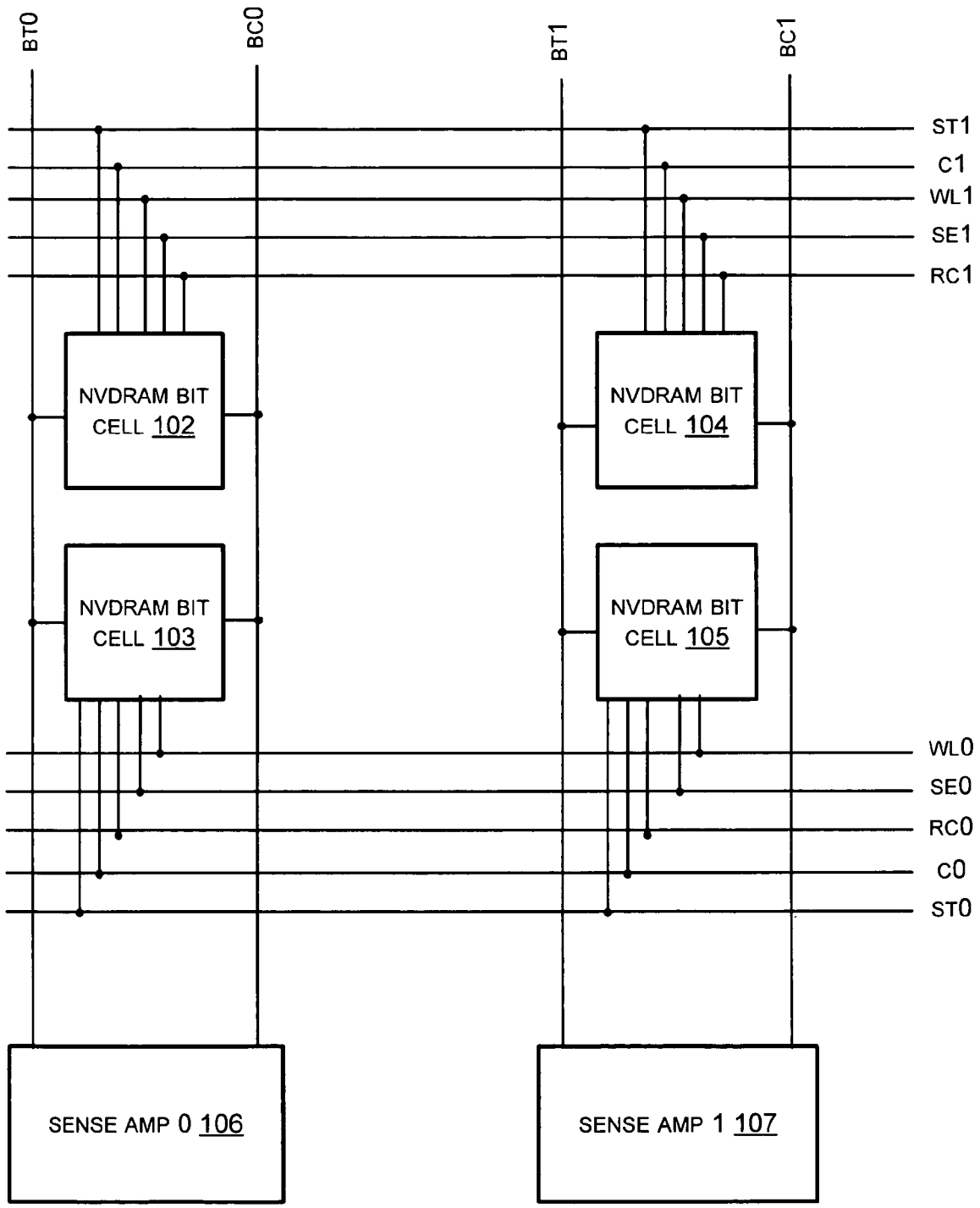
FIG. 1 is a block diagram of an embodiment of a memory system including combined volatile nonvolatile bit cells.

References to "one embodiment" or "an embodiment" do not necessarily refer to the same embodiment, although they may.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list.

"Logic" refers to signals and/or information that may be applied to influence the operation of a device. Software, hardware, and firmware are examples of logic. Hardware logic may be embodied in circuits. In general, logic may comprise combinations of software, hardware, and/or firmware.

Those skilled in the art will appreciate that logic may be distributed throughout one or more devices, and/or may be comprised of combinations of instructions in memory, processing capability, circuits, and so on. Therefore, in the interest of clarity and correctness logic may not always be distinctly illustrated in drawings of devices and systems, although it is inherently present therein.

Embodiments of the memory array architecture and sensing scheme described herein may be employed with various nvDRAM bit and charge cell devices, for example, but in no way limited to, those disclosed in the following co-pending, commonly-assigned applications:

The application titled "5T HIGH DENSITY NVDRAM CELL", filed on Dec. $31^{st}$, 2007, and having the application number 12/006,279.

The application titled "3T HIGH DENSITY NVDRAM CELL", filed on Dec. $31^{st}$, 2007, and having the application number 12/006,227.

The described memory array architecture and sensing scheme may be employed with memory cells comprising an integration of DRAM and FLASH structures (nvDRAM) in a single nvDRAM cell. Differential sensing of 'true' and complement bit information may be provided using low voltage (i.e. DRAM-level voltage) bit lines (BT and BC). Differential sensing is often more robust and less susceptible to errors than non-differential approaches. Memory operations of volatile READ, volatile WRITE, STORE, ERASE, and RECALL may be accomplished on a page-wide scope. A single low (DRAM-level) voltage sense amplifier may be employed for volatile and non-volatile operations, even though some non volatile operations (e.g. STORE, ERASE) may involve higher voltages (e.g. FLASH-level voltages) at a single gate inside the nvDRAM cells, this higher voltage may not have significant influence on the lower voltage nvDRAM cell interface. Non-volatile bit information may be written to the nvDRAM cell by using low voltage signals on BT and BC.

In this manner, a high-density nvDRAM array may be provided having a single low voltage interface to the sensing devices with a common (sensing) interface for volatile and non-volatile operation. This may be accomplished using a relatively low number of control lines per memory cell. The complexity of the sensing devices may be reduced due to a lower number of control signals and use of common low voltage bit lines for both volatile and nonvolatile operations. Memory operations may be carried out using a clocked synchronous approach, with robust differential sensing, high noise immunity, and high volatile operation speed.

The architecture and sensing scheme may provide for a fully symmetric memory cell layout, with a highly parallel data interface via bit lines, no external interface employed between volatile and nonvolatile bit storage, and only one high voltage control line (SE) per page of memory. The lack of external interfaces between volatile and nonvolatile storage may reduce complexity, power consumption, capacitive loads, and may increase parallelism in such operations as STORE and RECALL over conventional approaches.

FIG. 1 is a block diagram of an embodiment of a memory system including combined volatile nonvolatile bit cells. The system, which may be arranged as an array of cells, comprises bit cells 102-105. The array comprises sense amplifiers 106 and 107. Data is presented to and retrieved from cells 102-105 using bit lines BT0 and BT1, and compliment bit lines BC0 and BC1. Signal paths SE0 and SE1 are used to apply high (e.g. higher than DRAM) voltages for ERASE and STORE operations on nonvolatile memory. Signal paths RC0 and RC1 are also used for operations on nonvolatile memory, RECALL in particular. The word lines WL0 and WL1 are activated for both volatile and nonvolatile operations, to couple internal structures of the cells 102-105 with the bit lines and their complement lines. Signal paths C0, C1, ST0 and ST1 may be used in various ways, depending upon the implementation. Some examples of how the various signal lines may be used during volatile and nonvolatile memory operations are provided below.

Each memory cell 102-105 acts to store a volatile and non-volatile memory bit. Additionally, each memory bit cell 102-105 acts to store a compliment to the volatile and non-volatile memory bits. During some operations, such as READ, WRITE, and STORE, the sense amplifiers 106 and 107 may react to differential voltages on the bit lines BTx and complement bit lines BCx to drive the bit line voltage levels to unambiguous logical zeros and ones. During other operations, such as RECALL, the sense amplifiers 106 and 107 may react to current flows on the bit lines BTx and complement bit lines BCx to drive the bit line voltage levels to unambiguous logical zeros and ones.

The array provides both volatile and non-volatile memory capability, with each cell 102-105 providing charge storage for both. Storing data into the volatile memory of cells 102-105 is performed using WRITE operations. Reading data from volatile memory of cells 102-105 is performed with READ operations. Storing data into the non-volatile memory of cells 102-105 is performed using STORE (e.g. FLASH WRITE) operations. STORE operations may be preceded by a nonvolatile ERASE (e.g. FLASH ERASE), which clears any stored nonvolatile bit. This operation may be performed by page, block, or on the entire array. Reading data from the non-volatile memory of cells 102-105 is performed with RECALL operations.

In FIG. 1, two nvDRAM bit cells 102 and 103 have been associated with BT0 and BC0. Two nvDRAM bit cells 104 and 105 have been associated with BT1 and BC1. Word line WL0 has two cells 103 and 105 associated with it. Word line WL1 has two cells 102 and 104 associated with it. Of course, these are merely examples for the purpose of illustration, and in practice many more cells may be associated with particular word lines and bit lines.

Figure 2:
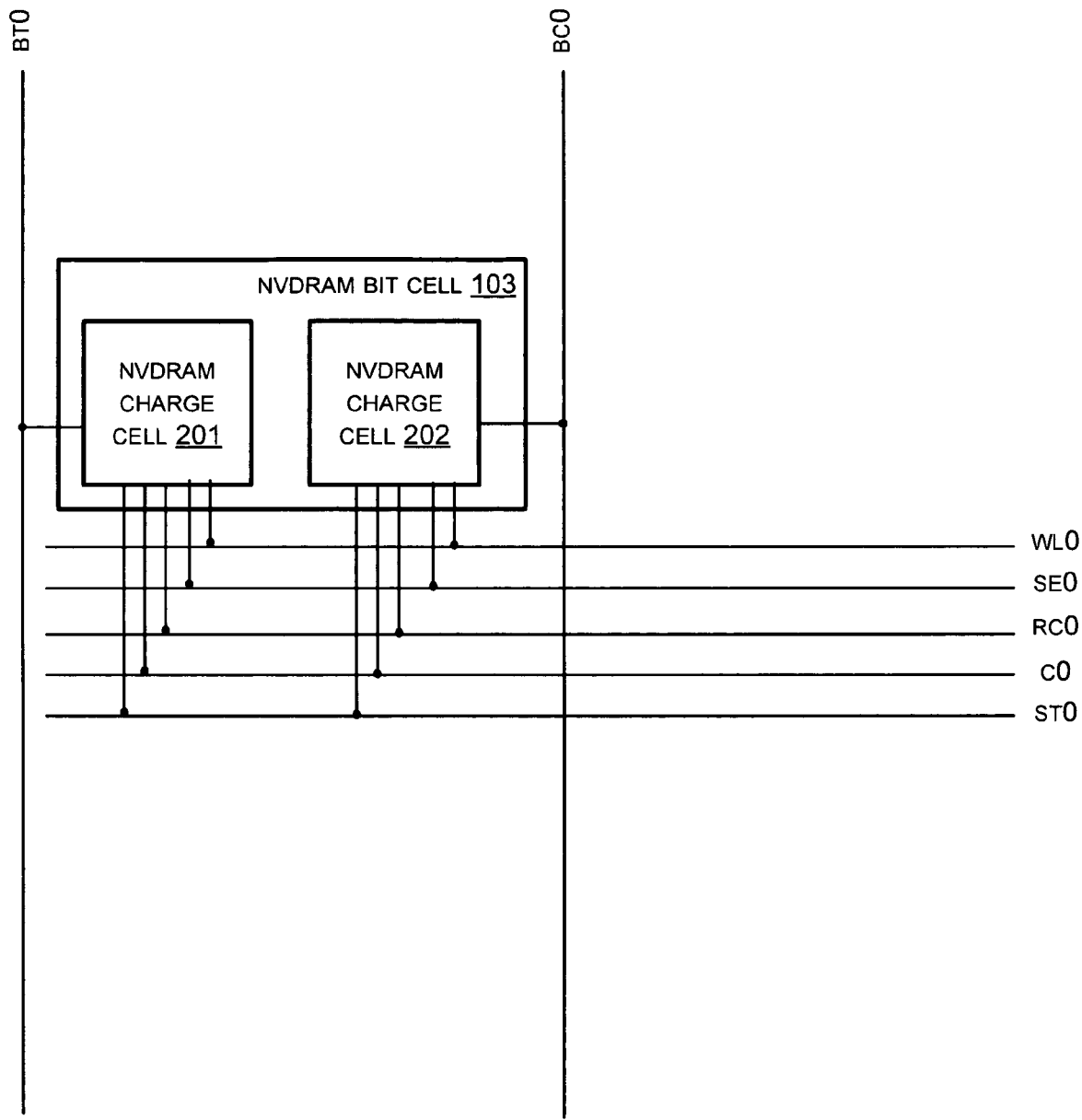
FIG. 2 is a block diagram of an embodiment of a combined volatile nonvolatile bit cell for use in the system of FIG. 1, in more detail.

FIG. 2 is a block diagram of an embodiment of a combined volatile nonvolatile bit cell in more detail. The bit cell 103 comprises two charge cells 201 and 202. One charge cell 201 is coupled to bit line BT0. The second charge cell is coupled to compliment line BC0. When BT0 is used to write a one (e.g. high state) into charge cell 201, BC0 may simultaneously be used to write the logical compliment, a zero, into charge cell 202, and visa versa.

The word line WL0 and the signals SE0, RC0, C0, and ST0 are each coupled to the two charge cells 201 and 202.

Figure 3:
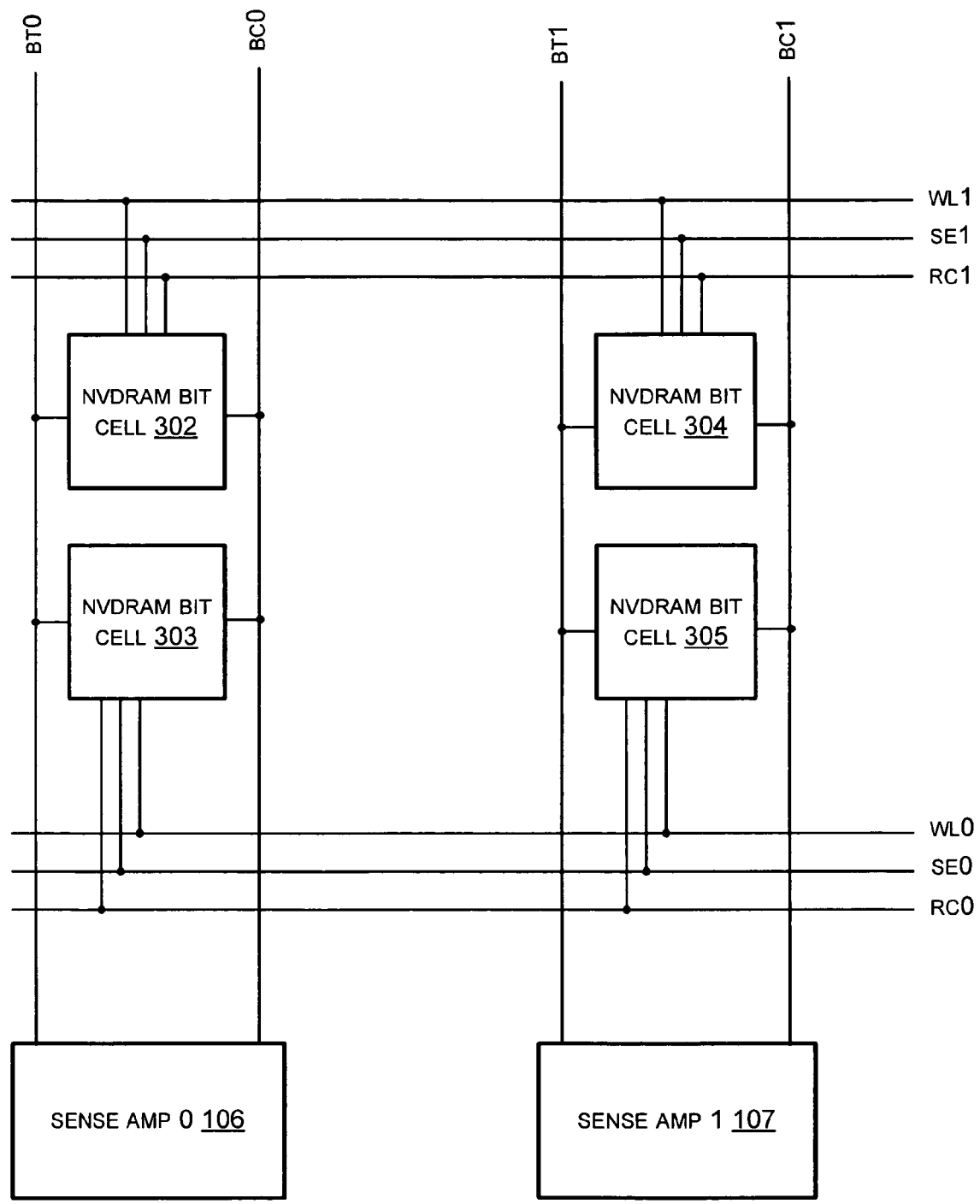
FIG. 3 is a block diagram of an embodiment of a memory system including combined volatile nonvolatile bit cells.

Some embodiments of nvDRAM cells may not involve one or more of the signal lines described in conjunction with FIGS. 1 and 2. For example, FIG. 3 is a block diagram of an embodiment of a memory system including combined volatile nonvolatile bit cells that does not use the signal lines C and ST. The system, which may be arranged as an array of cells, comprises bit cells 302-305. The architecture and sense amplification scheme are otherwise substantially identical to the ones described in relation to the embodiments of FIGS. 1 and 2. For example, data is presented to and retrieved from cells 302-305 using bit lines BT0 and BT1, and compliment bit lines BC0 and BC1. The signal paths SE0 and SE1 are used to apply high voltages for ERASE and STORE operations on nonvolatile memory, and the signal paths RC0 and RC1 are also used for operations on nonvolatile memory, RECALL in particular which is may be a low (e.g. DRAM level) voltage operation. The word lines WL0 and WL1 are activated for both volatile and nonvolatile operations, to couple internal structures of the cells 302-305 with the bit lines and their complement lines.

During some operations, such as READ, WRITE, and STORE, the sense amplifiers 106 and 107 may react to differential voltages on the bit lines BTx and complement bit lines BCx to drive the bit line voltage levels to unambiguous logical zeros and ones. During other operations, such as RECALL, the sense amplifiers 106 and 107 may react to current flows on the bit lines BTx and complement bit lines BCx to drive the bit line voltage levels to unambiguous logical zeros and ones.

For the purpose of illustration, only a few bit cells have been illustrated. In practice, many more cells may be associated with particular word lines and bit lines to make up the full memory array.

Figure 4:
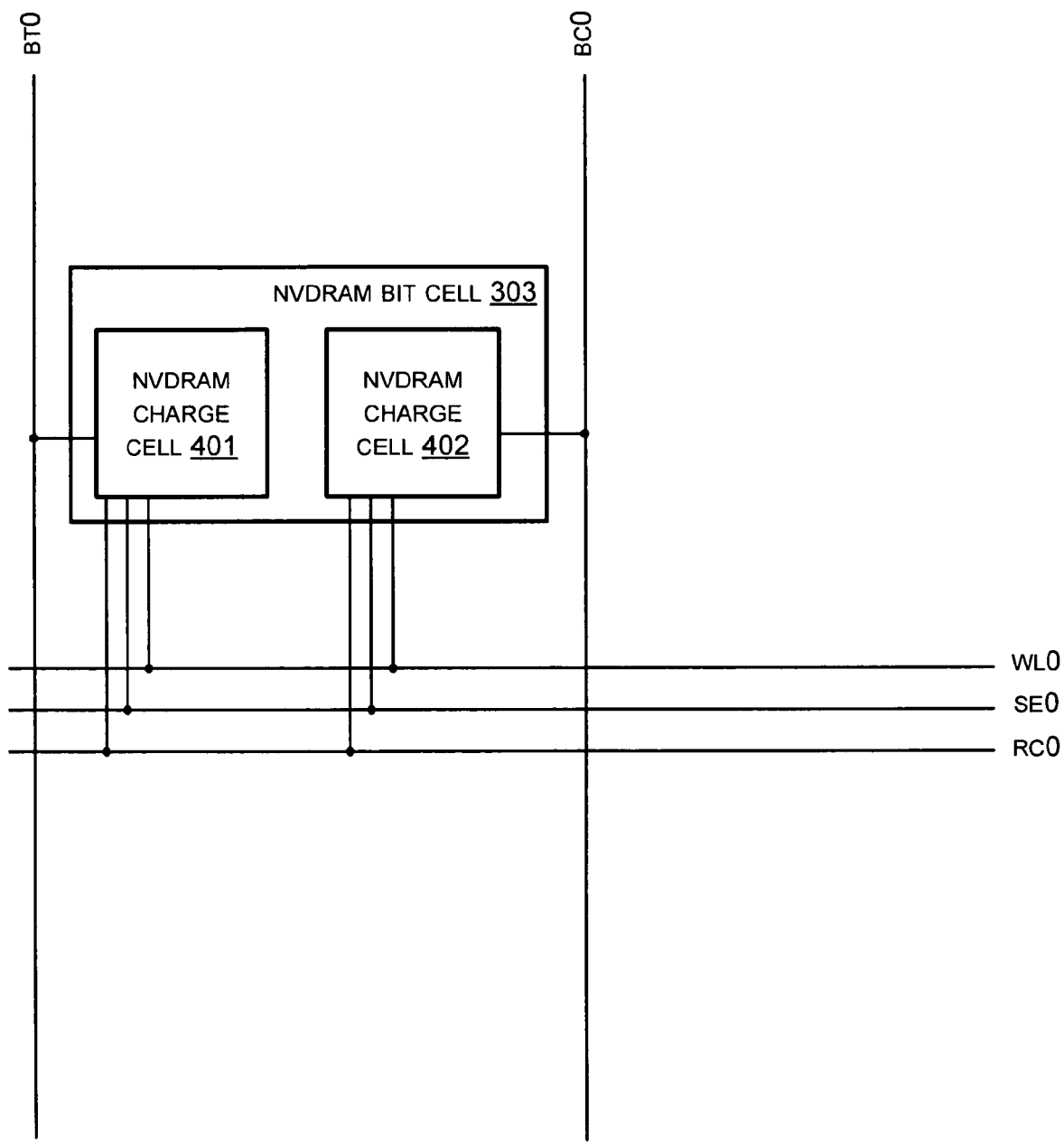
FIG. 4 is a block diagram of an embodiment of a combined volatile nonvolatile bit cell for use in the system of FIG. 3, in more detail.

FIG. 4 is a block diagram of an embodiment of a combined volatile nonvolatile bit cell for use, for example, in the architecture of FIG. 3, in more detail. The bit cell 303 comprises two charge cells 401 and 402. One charge cell 401 is coupled to bit line BT0. The second charge cell is coupled to compliment line BC0. When BT0 is used to write a one (e.g. high state) into charge cell 401, BC0 may simultaneously be used to write the logical compliment, a zero, into charge cell 402, and visa versa. The word line WL0 and the signals SE0 and RC0 are each coupled to the two charge cells 401 and 402.

The following memory operation descriptions refer to a single charge cell of the charge cell pair. In general, operations of one charge cell will likewise be carried out for the paired charge cell, which stores charges representing complement values of the volatile and nonvolatile bits of the charge cell with which it is paired.

Volatile READ

To begin the READ, the bit line may be pre-charged, in some embodiments to a level around halfway between high and low, for example Vcc/2 (T0). Assume for discussion that a volatile 'one' bit is stored in the charge cell (v-bit=1). When WL is asserted, the charge of the v-bit may affect the voltage level of the bit line, moving the voltage level of the bit line higher or at least not moving the bit line voltage down. The sense amplifier engages and drives the bit line to logical one. Now assume storage of a volatile 'zero' bit (v-bit=0). When the stored v-bit is a zero, when WL is asserted, charge flows from the pre-charged bit line into v-bit. This pulls down the voltage on the bit line by a small amount. The sense amplifier engages and drives the bit line to logical zero.

After the value of v-bit is sensed, the voltage on the bit line will determine the setting of v-bit. If the bit line is at logical zero, v-bit remains uncharged and a zero v-bit is stored when WL is dropped low. If the bit line is logical one, v-bit is recharged and a one v-bit is stored when WL is dropped low. In other words, v-bit is "refreshed" after the READ operation. As previously indicated, during READ similar operations (but for complement v-bit values) occur for the complement charge cell and complement bit line, enabling the sense amplifier to detect differential voltages on BT and BC. After a READ, the bit lines may be reset to pre-charge levels.

Bit line voltage sensing during volatile READ operations may be based upon small differential voltages on the bit line and complement bit line. This may differ in some embodiments from bit line sensing during nonvolatile RECALL operations, which may be based more upon detecting current flows (or using significant current flows from the memory cells to the bit lines to charge the bit lines from low levels) than on detecting small voltage differentials.

In some embodiments, one or more of signals C, ST, and SE may be asserted during READ in order couple the stored v-bit charge with the bit line (e.g. embodiments with more dispersed v-bit storage in the nvDRAM cell).

Volatile WRITE

When writing a one to v-bit, the bit line is set to 'one', or logical high. WL is then driven high. If there is no charge in v-bit storage (a previously stored v-bit of zero), charge flows from the bit line to v-bit storage. Otherwise v-bit is unchanged. WL is brought low and a one is thus stored in v-bit storage. The bit line and complement line may be reset to pre-charge levels.

When writing a zero to v-bit, the bit line is driven to zero, or logical low. WL is driven high. If there is a charge in v-bit storage (a previously stored volatile bit of 'one'), charge drains from v-bit storage to the bit line. Otherwise v-bit is unchanged. WL is driven low and a zero is thus stored in v-bit storage.

As with READ, in some embodiments, one or more of the signals C, ST, and SE may be asserted during WRITE in order couple the stored v-bit charge with the bit line (e.g. embodiments with more dispersed v-bit storage in the nvDRAM cell).

Non-Volatile STORE

STORE of a value from v-bit to nv-bit may be accomplished by first READing the v-bit charge to the bit line (see the description of volatile READ), and then asserting SE to a "program" level Vprog. In some embodiments Vprog may be higher than the voltage representing a logical one bit. For example, in some embodiments, Vprog may be approximately +10V. Asserting Vprog causes the storage of the value of v-bit to nv-bit within the nvDRAM cell. The sense amplifier will hold the bit line low or high (depending on the value of v-bit) while the v-bit value is 'trapped' to the nv-bit value within the nvDRAM cell. STORE of the complement v-bit to complement nv-bit works in substantially the same way.

After the v-bit value is stored to nv-bit, the voltage on the bit line will determine the setting of v-bit. If the bit line is at logical zero, v-bit remains uncharged and a zero volatile bit is stored when WL is dropped. If the bit line is at logical one, v-bit is recharged and a one volatile bit is stored when WL is dropped. In other words, v-bit is "refreshed" after the STORE operation.

In some embodiments, a STORE will not overwrite an nv-bit of one with a v-bit of zero. Thus nv-bit (and complement nv-bit) may be cleared (an ERASE performed) prior to performing a STORE, in order to ensure that during STORE nv-bit either remains a zero (if v-bit is a zero) or is flipped to a one if v-bit is one.

As with READ and WRITE, in some embodiments, one or more of the signals C and ST may be asserted during STORE in order to couple the stored v-bit charge with the bit line and with the nv-bit storage (e.g. embodiments with more dispersed v-bit storage in the nvDRAM cell).

Non-Volatile ERASE

An ERASE may set nv-bit and complement nv-bit to a known state (for example, to logical one). In some embodiments, to effect an ERASE, SE may be set to a relatively high negative value −Vprog, such as for example −10V.

In some embodiments, due to the nature of how charge is stored within the nvDRAM cell, ERASE may affect the value of v-bit. Thus in some embodiments, a READ of v-bit to the bit line/sense amp may precede the ERASE, and a WRITE from the bit line/sense amp to v-bit may follow ERASE. This may act to prevent changes to v-bit as a result of ERASE. In other words, v-bit is "refreshed" after the ERASE operation. This process also acts to restore nv-bit and complement nv-bit to complement values after the ERASE.

Non-Volatile RECALL

RECALL of a stored nv-bit value to v-bit may be accomplished by first causing nv-bit to be represented on the bit line (i.e. 'nvREAD'), then performing a WRITE to store the nv-bit value in v-bit.

To perform an nvREAD, both the bit line and complement bit lines may first be driven low. RC and WL may be driven high. SE may be set low. Setting SE low may result in the channel of nv-bit storage transistors switching "off", unless the stored value of nv-bit is "one", in which case the nv-bit storage transistor(s) will remain "on" or at least allow some current to pass through.

The net effect is that if nv-bit stores a 'one', the nvDRAM cell will pass current to the bit line. The bit line will be pulled toward a high value, and the sense amplifier will detect the current and engage to drive the bit line fully to 'one'. Otherwise, if nv-bit stores a zero, the nvDRAM cell will not pass current to the bit line. The bit line will remain at a low value, and no current will be detected by the sense amplifier.

Thus, bit line value sensing during RECALL may be based upon sensing current flow on the bit line. This may differ in some embodiments from bit line sensing during other operations, which may be based more upon detecting small voltage differentials between BT and BC than on sensing current flows. Once the nv-bit value is sensed, a WRITE may be performed to store the value represented on the bit line to v-bit.

Some embodiments may employ an additional signal to the nvDRAM cells, to provide the source of current from the nvDRAM cell to the bit line during RECALL that may be switched off otherwise. This signal may also be used during STORE and even ERASE, to reduce unwanted bias voltages in the nvDRAM caused by the higher potentials on SE used during ERASE and STORE.

A device may be constructed comprising a memory array and sensing scheme in accordance with the embodiments described herein. The device will typically comprise at least one processor, for example a general purpose microprocessor, an embedded special-purpose processor, a digital signal processor, and so on. The processor may interact with a memory array to read and write data during system operation. The memory array may nvDRAM cells and sensing devices, in accordance with the structures and techniques described herein.

Those having skill in the art will appreciate that there are various vehicles by which processes and/or systems described herein can be effected (e.g., hardware, software, and/or firmware), and that the preferred vehicle will vary with the context in which the processes are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A memory system comprising:
    a plurality of nvDRAM cells;
    a plurality of sense amplifiers; and
    the nvDRAM cells comprising a single data interface, the single data interface coupling the nvDRAM cells to the sense amplifiers, the sense amplifiers configured to operate with current sensing during RECALL operations, and with differential voltage sensing otherwise.

2. The memory system of claim 1, wherein the plurality of nvDRAM cells further comprising:
    each nvDRAM cell comprising a pair of charge cells, one charge cell coupled to a true bit line and not to a complement bit line, the other coupled to the complement bit line and not to the true bit line.

3. The memory system of claim 1, further comprising:
    the nvDRAM cells comprising a single control interface, the single control interface comprising a single higher than DRAM level control signal line.

4. A device comprising:
    at least one processor, and
    a memory system comprising a plurality of nvDRAM cells and a plurality of sense amplifiers, the nvDRAM cells comprising a single data interface, the single data interface coupling the nvDRAM cells to the sense amplifiers, the sense amplifiers configured to operate with current sensing during RECALL operations, and with differential voltage sensing otherwise.

5. The device of claim 4, wherein the plurality of nvDRAM cells further comprises:
    each nvDRAM cell comprising a pair of charge cells, one charge cell coupled to a true bit line and not to a complement bit line, the other coupled to the complement bit line and not to the true bit line.

6. The device of claim 4, further comprising:
    the nvDRAM cells comprising a single control interface, the single control interface comprising a single higher than DRAM level control signal line.

7. A process of operating a memory array comprising:
    performing all volatile and nonvolatile operations on an nvDRAM cell array via a single data interface and operating sense amplifiers with current sensing during RECALL operations, and with differential voltage sensing otherwise.

8. The process of operating a memory array of claim 7, further comprising:
using only a single control line for all control signals to the nvDRAM that exceed DRAM levels.

9. The memory system of claim 1, further comprising:
an additional current source to the nvDRAM cells that is switched on during RECALL and switched off otherwise.

10. The memory system of claim 1, further comprising:
an additional current source to the nvDRAM cells that is switched on during RECALL and one or more of STORE and ERASE, and switched off otherwise.

11. The device of claim 4, further comprising:
an additional current source to the nvDRAM cells that is switched on during RECALL and switched off otherwise.

12. The device of claim 4, further comprising:
an additional current source to the nvDRAM cells that is switched on during RECALL and one or more of STORE and ERASE, and switched off otherwise.

13. The process of claim 7, further comprising:
applying an additional current source to cells of the nvDRAM during RECALL, and switching off the current source otherwise.

14. The process of claim 7, further comprising:
applying an additional current source to cells of the nvDRAM during RECALL and one or more of STORE and ERASE, and switching off the current source otherwise.

* * * * *